United States Patent [19]

Nakamura

[11] Patent Number: 5,270,581
[45] Date of Patent: Dec. 14, 1993

[54] SEMICONDUCTOR INTEGRATED CIRCUIT DEVICE HAVING STEP-DOWN CIRCUIT ASSOCIATED WITH COMPONENT CIRCUITS ARRANGED IN LOW-POWER CONSUMPTION MANNER

[75] Inventor: Kazuyuki Nakamura, Tokyo, Japan

[73] Assignee: NEC Corporation, Japan

[21] Appl. No.: 868,442

[22] Filed: Apr. 14, 1992

[30] Foreign Application Priority Data

Apr. 15, 1991 [JP] Japan .................... 3-82159

[51] Int. Cl.[5] .................. H03K 3/01; G06G 7/12
[52] U.S. Cl. .................. 307/296.1; 307/262;
307/296.6; 307/490.491; 307/494; 307/270;
323/313; 323/315; 323/316
[58] Field of Search ............... 307/262, 296.1, 296.6,
307/490-491, 494, 270; 323/315-316, 313

[56] References Cited

U.S. PATENT DOCUMENTS

| | | | |
|---|---|---|---|
| 4,450,367 | 5/1984 | Whatley | 323/315 |
| 4,943,737 | 7/1990 | Guo et al. | 307/296.7 |
| 5,045,773 | 9/1991 | Westwick et al. | 323/316 |
| 5,132,555 | 7/1992 | Takahashi | 307/296.1 |
| 5,140,191 | 8/1992 | Nogle et al. | 307/270 |

Primary Examiner—Margaret R. Wambach
Attorney, Agent, or Firm—Ostrolenk, Faber, Gerb & Soffen

[57] ABSTRACT

A semiconductor integrated circuit device is equipped with a step-down circuit for producing a step-down power voltage from a power voltage level, and first and second component circuits of the semiconductor integrated circuit device are coupled between the power voltage line and the step-down power voltage line and between the step-down power voltage line and the ground voltage line, respectively, so that current passing through the first component circuit is reused by the second component circuit, thereby improving current consumption.

9 Claims, 7 Drawing Sheets

SEMICONDUCTOR INTEGRATED CIRCUIT DEVICE HAVING STEP-DOWN CIRCUIT ASSOCIATED WITH COMPONENT CIRCUITS ARRANGED IN LOW-POWER CONSUMPTION MANNER

FIELD OF THE INVENTION

This invention relates to a semiconductor integrated circuit device and, more particularly, to a circuit arrangement for component circuits and a step-down circuit improved in power consumption.

DESCRIPTION OF THE RELATED ART

Dimensions of a transistor have been scaled down, and millions of transistors are integrated on a single semiconductor chip. Another technical trend is integration of different types of transistor. There is a trade-off between a field effect transistor and a bipolar transistor, by way of example, and circuit designers fabricate integrated circuit devices from appropriate component transistors. Such a compromise integrated circuit is known as "Bi-CMOS integrated circuit". However, the miniaturization of the component transistors encounters a problem in reliability. For example, the scaled down field effect transistor is affected by hot electrons due to strong electric field created therein, and a step-down power voltage is effective against the attack of hot electrons. In fact, some large scale integrated circuits are operative with a step-down power voltage, and the step-down power voltage is internally produced in view of compatibility with the previous version.

Figure 1:
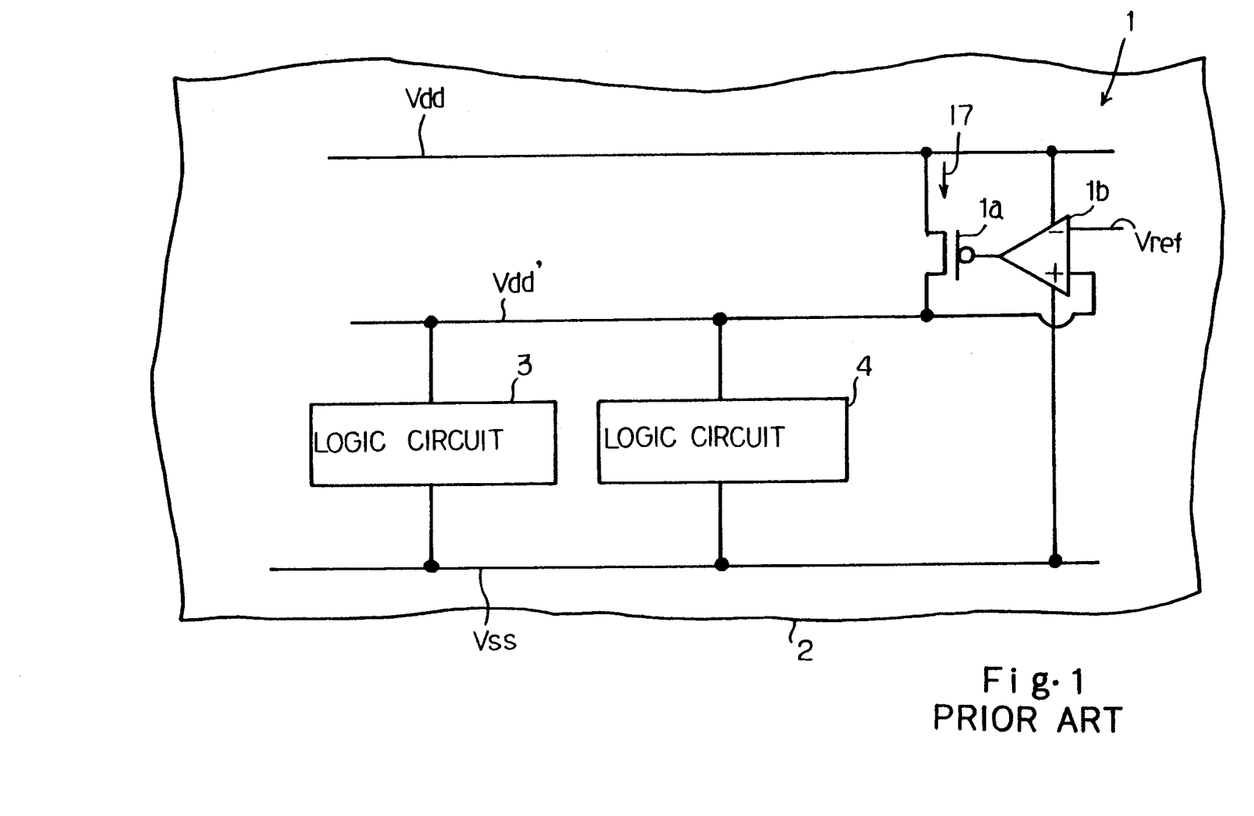
FIG. 1 is a circuit diagram showing the circuit arrangement of the prior art semiconductor integrated circuit.

FIG. 1 shows a prior art step-down circuit disclosed by Koike et. al., Proceedings of 1989 Spring National Convention of Electron Information Communication Society, vol. 5, page 315. The prior art step-down circuit 1 is integrated on a semiconductor chip 2 together with logic circuits 3 and 4, and comprises a field effect transistor 1a coupled between a power voltage line Vdd of 5 volts and a step-down power voltage line Vdd' and an operational amplifier circuit coupled between the power voltage line Vdd and a ground voltage line Vss of zero volt. The inverted node of the operational amplifier circuit 1b is coupled with a reference voltage line Vref of 3.3 volts, and the non-inverted node is coupled with the step-down power voltage line Vdd'. The gate electrode of the field effect transistor 1a is coupled with the output node of the operational amplifier circuit 1b, and the operational amplifier circuit 1b controls the field effect transistor 1a in such a manner that the step-down power voltage line Vdd' is equal in voltage level to the reference voltage line Vref.

However, a problem is encountered in the prior art step-down circuit 1 in that a large amount of electric power is consumed by the step-down circuit 1. The logic circuits 3 and 4 are assumed to consume average current I1, and electric power EP1 consumed by the step-down circuit is given as $$EP1 = (Vdd - Vdd') \times I1 \qquad \text{Equation 1}$$

Since the differential voltage (Vdd - Vdd') is 1.7 volts, about 33% of the total electric power is consumed by the step-down circuit 1.

SUMMARY OF THE INVENTION

It is therefore an important object of the present invention provide a semiconductor integrated circuit which is arranged in such a manner as to decrease the power consumption.

To accomplish the object, the present invention proposes to selectively couple component circuits between a first power voltage line and a step-down power voltage line and between the step-down power voltage line and a second power voltage line.

In accordance with the present invention, there is provided a semiconductor integrated circuit device fabricated on a single semiconductor chip, comprising: a) a first power voltage line for propagating a first power voltage level; b) a step-down power voltage line for propagating a step-down power voltage level; c) a second power voltage line for propagating a second power voltage level different from the first power voltage level as well as from the step-down power voltage level; d) a step-down circuit operative to produce the step-down voltage level from the first and second power voltage levels, and supplying the step-down power voltage level to the step-down power voltage line; e) at least one first component circuit coupled between the first power voltage line and the step-down power voltage line; and f) at least one second component circuit coupled between the step-down power voltage line and the second power voltage line.

BRIEF DESCRIPTION OF THE DRAWINGS

The feature and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 2:
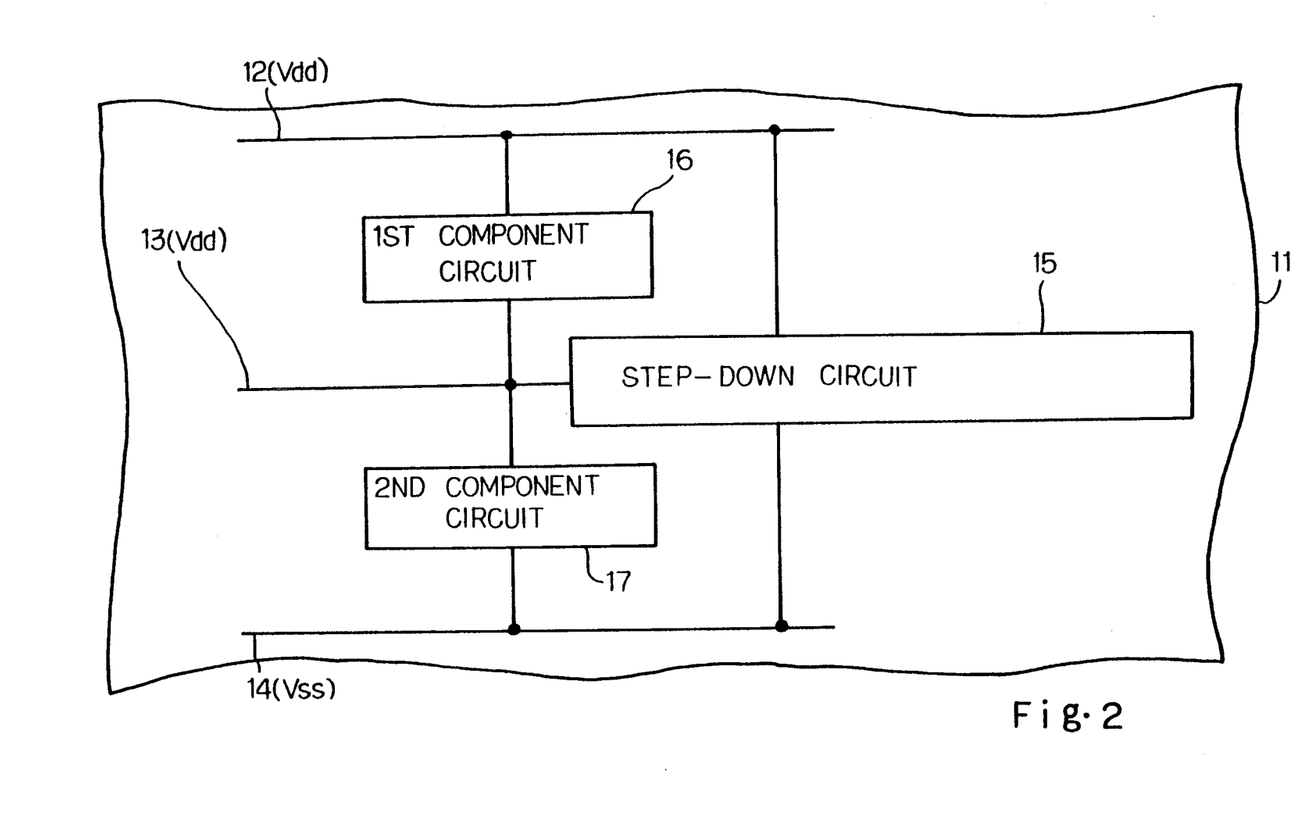
FIG. 2 is a block diagram showing the circuit arrangement of a semiconductor integrated circuit device according to the present invention.

Referring to FIG. 2 of the drawings, a semiconductor integrated circuit device embodying the present invention is fabricated on a single semiconductor chip 11, and comprises a first power voltage line 12, a step-down power voltage line 13, a second power voltage line 14, a step-down circuit 15, a first component circuit 16 and a second component circuit 17. The first and second power voltage lines 12 and 14 respectively propagate a first power voltage level Vdd and a second power voltage level Vss different from each other, and a step-down power voltage level Vdd' is produced from the first and second power voltage levels Vdd and Vss. The component transistors of the first component circuit 16 are different in type from the component transistors of the second component circuit 17, and the operating differential voltage of the first component circuit 16 differs from the operating differential voltage for the second component circuit 17. The first and second component circuits 16 and 17 may be respectively implemented by field effect transistors and by bipolar transistors.

Figure 3:
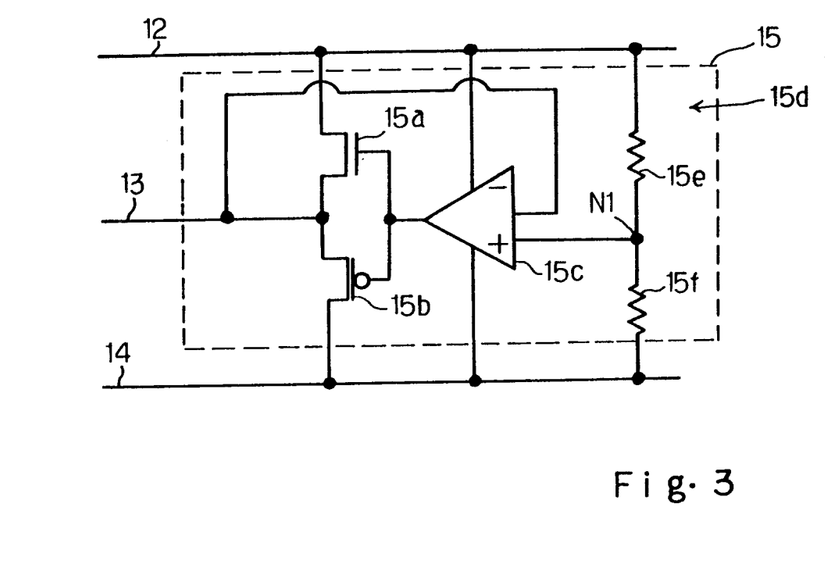
FIG. 3 is a circuit diagram showing the circuit arrangement of a step-down circuit incorporated in the semiconductor integrated circuit device shown in FIG. 2.

The circuit arrangement of the step-down circuit 15 is illustrated in FIG. 3 of the drawings, and the step-down circuit 15 comprises a series combination of an n-channel enhancement type field effect transistor 15a and a p-channel enhancement type field effect transistor 15b, and an operational amplifier circuit 15c. The source nodes of the field effect transistors 15a and 15b are respectively coupled with the first power voltage line 12 and the second power voltage line 14, and the common drain node is coupled with the step-down power voltage line 13. The operational amplifier circuit 15c has an inverted input node coupled with the step-down power voltage line 13 and a non-inverted input node coupled with a voltage divider 15d implemented by a series of resistors 15e and 15f. The operational amplifier circuit 15c further has an output node coupled with the gate electrodes of the field effect transistors 15a and 15b, and, accordingly, the two field effect transistors 15a and 15b complementarily vary the channel conductances thereof depending upon the voltage level at the output node of the operational amplifier circuit 15c. The resistors 15e and 15f are adjusted in such a manner as to produce a reference voltage Vref at the output node N1 thereof, and the reference voltage Vref is matched with a certain value dividing the differential voltage between the first and second power voltage levels Vdd and Vss into the two different operating voltage range.

The operational amplifier circuit 15c controls the n-channel enhancement type field effect transistor 15a and the p-channel enhancement type field effect transistor 15b, and regulates the step-down power voltage level to be matched with the reference voltage level Vref. For this reason, the first component circuit 16 and the second component circuit 17 are operable on the individual appropriate operational voltage ranges. The electric power is directly supplied to the first component circuit 16, and is reused by the second component circuit 17. This results in drastic power saving of the semiconductor integrated circuit device.

Second Embodiment

Figure 4:
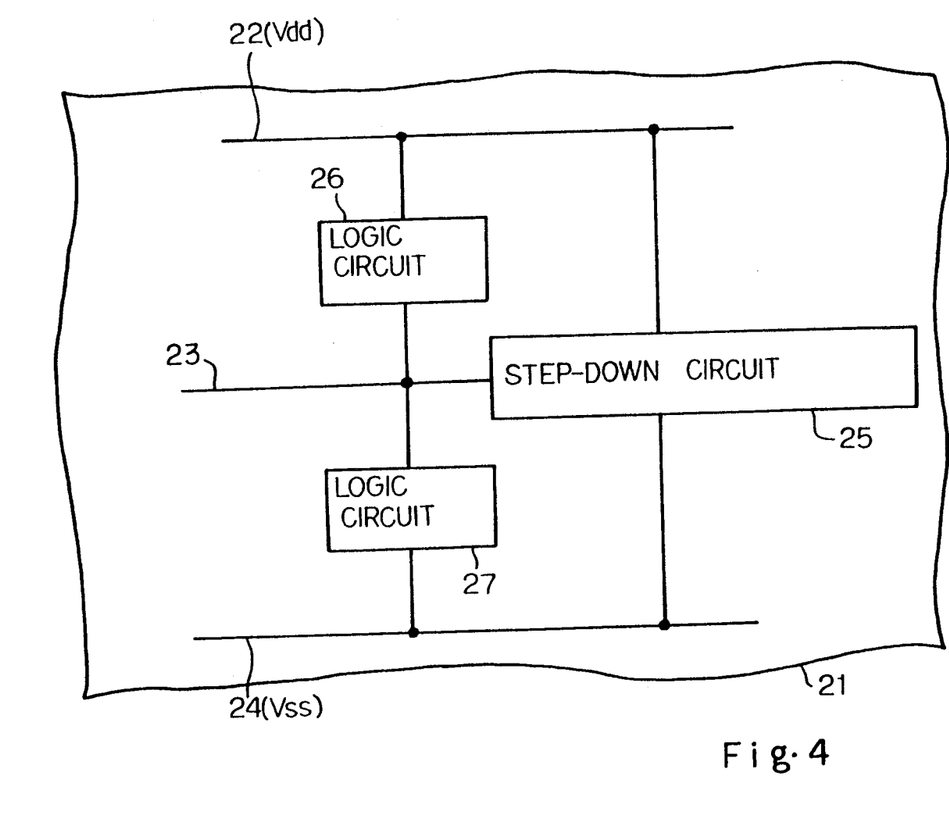
FIG. 4 is a block diagram showing the circuit arrangement of another semiconductor integrated circuit device according to the present invention.

Turning to FIG. 4 of the drawings, another semiconductor integrated circuit device embodying the present invention is fabricated on a single semiconductor chip 21, and comprises a first power voltage line 22, a step-down power voltage line 23, a second power voltage line 24, a step-down circuit 25, and first and second logic circuits 26 and 27. The first and second power voltage lines 22 and 24 respectively propagate a first power voltage level Vdd and a second power voltage level Vss different from each other, and a step-down power voltage level Vdd' is produced from the first and the second power voltage levels Vdd and Vss. The component transistors of the first logic circuit 26 are identical in type with the component transistors of the second logic circuit 27, and, accordingly, the first and second logic circuits 26 and 27 are operable in the same operating voltage range. The first and second logic circuits 26 and 27 may be implemented by either field effect or bipolar transistors. For this reason, the step-down power voltage level Vdd' is regulated to the mid point between the first and second power voltage levels Vdd and Vss.

The step-down circuit 25 is similar in circuit arrangement to the step-down circuit 15, however, the resistors of the voltage divider are approximately equal in resistance to each other.

The current passing through the first logic circuit 26 is reused by the second logic circuit 27, and, for this reason, only negligible current is consumed by the step-down circuit 25. This results in drastic improvement of power consumption. Moreover, a large number of logic circuits can be formed in the semiconductor integrated circuit device without large power distribution capability.

Third Embodiment

Figure 5:
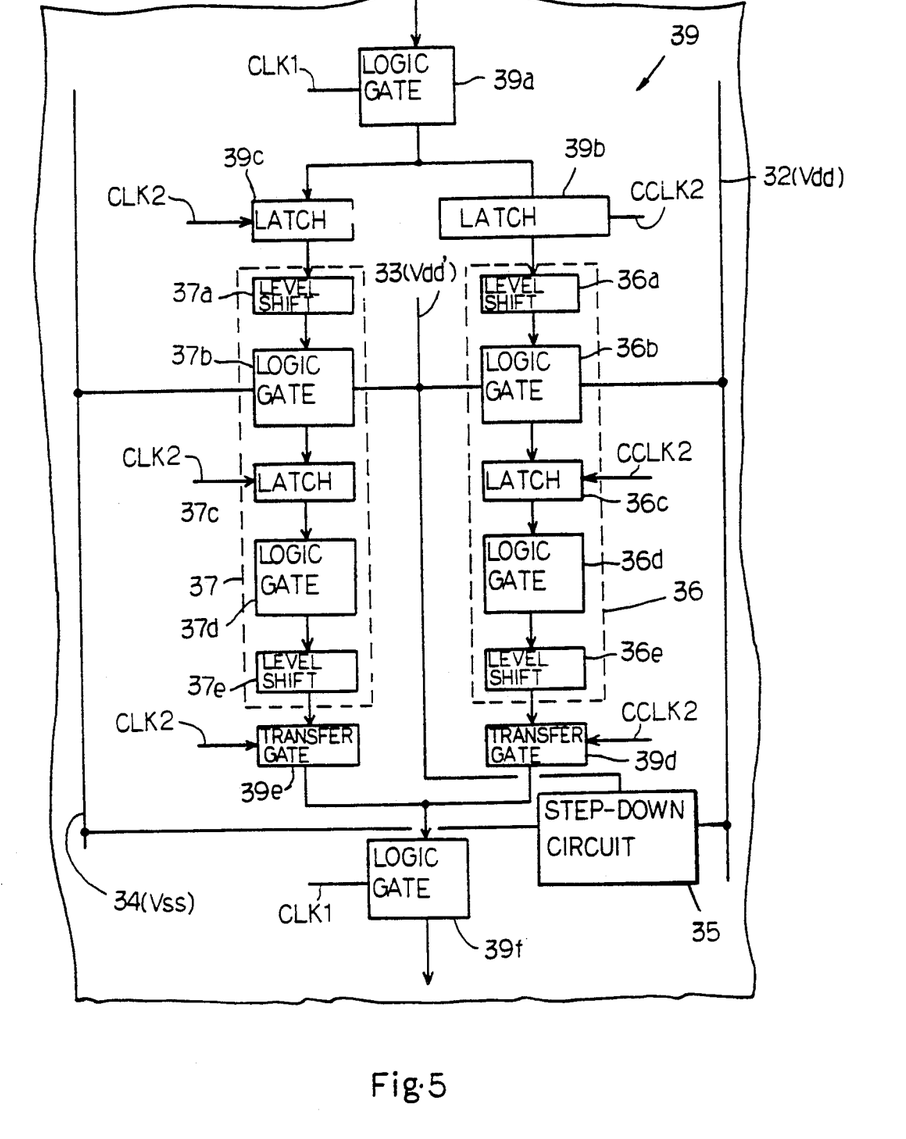
FIG. 5 is a block diagram showing the circuit arrangement of yet another semiconductor integrated circuit device according to the present invention.

Turning to FIG. 5 of the drawings, yet another semiconductor integrated circuit device embodying the present invention is fabricated on a single semiconductor chip 31, and comprises a first power voltage line 32, a step-down power voltage line 33, a second power voltage line 34, a step-down circuit 35, and first and second logic circuits 36 and 37. The first and second power voltage lines 32 and 34 respectively propagate a first power voltage level Vdd and a second power voltage level Vss different from each other, and a step-down power voltage level Vdd' is produced from the first and the second power voltage levels Vdd and Vss. The component transistors of the first logic circuit 36 are identical in type with the component transistors of the second logic circuit 37, and, accordingly, the first and second logic circuits 36 and 37 are operable in the same operating voltage range. For this reason, the step-down power voltage level Vdd' is regulated to the mid point between the first and second power voltage levels Vdd and Vss, and the step-down circuit 35 is similar in circuit arrangement to the step-down circuit 25.

The current passing through the first logic circuit 36 is reused by the second logic circuit 37, and, for this reason, only negligible current is consumed by the step-down circuit 35 as similar to the second embodiment.

Figure 6:
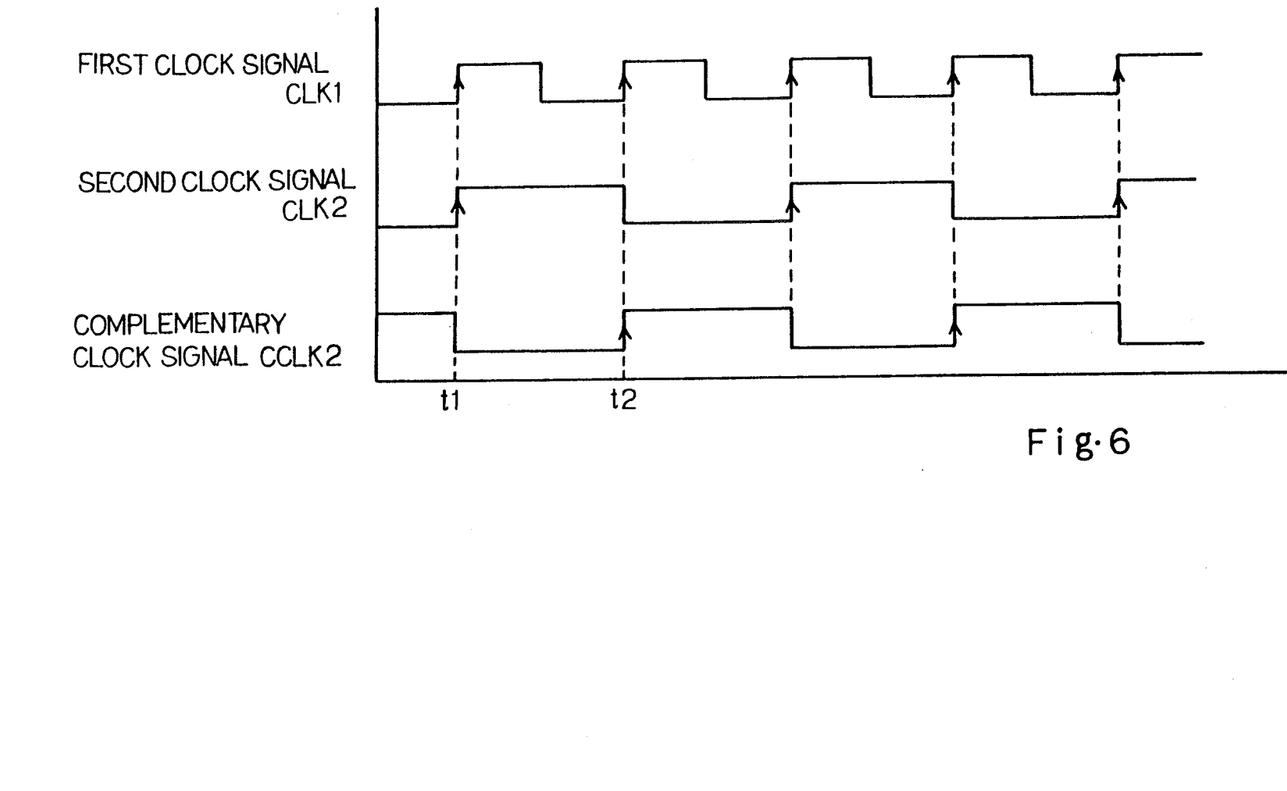
FIG. 6 is a diagram showing the waveforms of clock signals used in the semiconductor integrated circuit device according to the present invention.

The first logic circuit 36 comprises a level shifter 36a, a logic gate 36b, a data latch 36c, a logic gate 36d and a level shifter 36e coupled in series, and the second logic circuit 37 also comprises a level shifter 37a, a logic gate 37b, a data latch 37c, a logic gate 37d and a level shifter 37e. The first and second logic circuits 36 and 37 form in combination a parallel data processing path 38 intercalated in a serial data processing path 39. The series data processing path 39 comprises a logic gate 39a, a parallel combination of data latches 39b and 39c coupled between the logic gate 39a and the data latches 36a and 37a, a parallel combination of data latches 39d and 39e coupled with the level shifters 36e and 37e, and a logic gate 39f. The logic gates 39a and 39f of the serial data processing path 39 are responsive to a first clock signal CLK1, and the data latches 39c and 37c and the transfer gate 39e are responsive to a second clock signal CLK2. On the other hand, the data latches 39b and 36c and the transfer gate 39d are responsive to the complementary clock signal CCLK2 of the second clock signal CLK2, and the first clock signal CLK1 is twice as high in frequency as the second clock signal CLK2 as shown in FIG. 6.

The parallel data processing path 38 cooperates with the serial data processing path 39 as follows. The logic gate 39a carries out the logical operation on input data bits in synchronism with the first clock signal CLK1, and supplies the output data bits at times t1 and t2. The output data bit at time t1 is latched by the data latch 39c in synchronism with the second clock signal CLK2, and the output data bit at time t2 is latched by the data latch 39b in synchronism with the complementary clock signal CCLK2. The output data bits are transferred in parallel through the logic circuits 36 and 37 in synchronism with the second clock signal CLK2 and with the complementary clock signal CCLK2, respectively, and reach the respective transfer gates 39d and 39e. The transfer gate 39e is responsive to the second clock signal CLK2, and transfers the data bit to the logic gate 39f. However, the transfer gate 39e is responsive to the complementary clock signal CCLK2, and transfers the data bit to the same logic gate 39f. Since the logic gate 39f is responsive to the first clock signal CLK1 which is twice as high in frequency as the second clock signal CLK2, both data bits are serially supplied to the logic gate 39f, and the logic gate 39f carries out a logic operation on both data bits.

Thus, the parallel data processing path 38 is responsive to the low frequency clock signal CLK2 without any delay, and the current consumption is further decreased by virtue of the low frequency clock signal CLK2.

Fourth Embodiment

Figure 7:
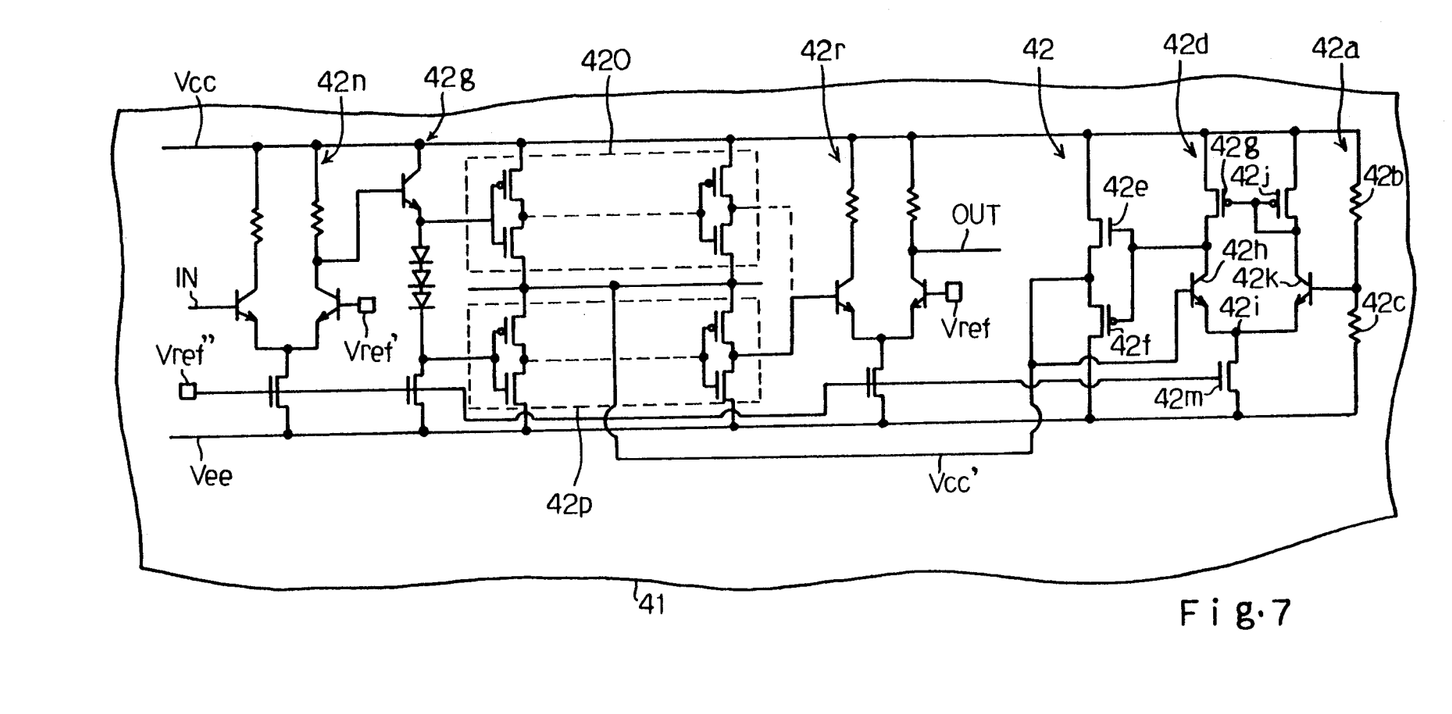
FIG. 7 is a circuit diagram showing the circuit arrangement of still another semiconductor integrated circuit device according to the present invention.

Turning to FIG. 7 of the drawings, a semiconductor integrated circuit device embodying the present invention is also fabricated on a single semiconductor chip 41, and has first and second power voltage lines Vcc and Vee, and a step-down power voltage line Vcc' produced from first and second power voltages by a step-down circuit 42. The step-down circuit 42 is similar in circuit arrangement to the step-down circuit FIG. 3. The step-down circuit 42 comprises a voltage divider 42a implemented by resistors 42b and 42c for producing a first reference voltage Vref, a current mirror circuit 42d responsive to the first reference voltage Vref and the step-down voltage level Vcc' for producing a control voltage signal CTL, and a series combination of an n-channel enhancement type field effect transistor 42e and a p-channel enhancement type field effect transistor 42f coupled between the first and second power voltage lines Vcc and Vee. In this instance, the resistors 42b and 42c are equal in resistance to each other, and the first reference voltage level Vref is regulated to the mid point between the first and second power voltage levels Vcc and Vee. The current mirror circuit 42d comprises a series combination of a p-channel enhancement type load transistor 42g and an n-p-n type bipolar transistor 42h coupled between the first power voltage line Vcc and a common emitter node 42i, a series combination of a p-channel enhancement type load transistor 42j and an n-p-n type bipolar transistor 42k also coupled between the first power voltage line Vcc and the common emitter node 42i, and an n-channel enhancement type activation transistor 42m coupled between the common emitter node 42i and the second power voltage line Vee. The n-p-n type bipolar transistors 42k and 42h are respectively responsive to the first reference voltage Vref and the step-down power voltage level Vcc', and the control voltage signal CTL is complementarily varied with respect to the step-down power voltage level Vcc'. Namely, if the step-down power voltage level Vcc' is decayed under the first reference voltage level Vref, the control voltage signal CTL is lifted, and the n-channel enhancement type field effect transistor 42e increases current passing therethrough for increasing the step-down power voltage level Vcc'. On the other hand, if the step-down power voltage level Vcc' exceeds the first reference voltage level Vref, the control voltage signal is decreased in voltage level, and the p-channel enhancement type field effect transistor 42f pulls down the step-down power voltage level Vcc'.

The semiconductor integrated circuit device shown in FIG. 7 further comprises an emitter coupled logic circuit 42n responsive to an input voltage signal IN and a second reference voltage level Vref', a first component circuit 42o implemented by a complementary inverting circuits coupled in cascade, a second component circuit 42p also implemented by a complementary inverting circuits coupled in cascade, a first level shifter 42q and a second level shifter 42r. Each of the complementary inverting circuits is referred to as "CMOS inverter", however, the abbreviation "MOS" does not mean Metal-Oxide-Semiconductor, because any type of field effect transistor such as, for example, an MIS transistor is available. Although the first and second component circuits 42o and 42p are fabricated from the CMOS inverting circuits only, other component circuits are fabricated from field effect transistors and bipolar transistors. For this reason, the semiconductor integrated circuit device shown in FIG. 7 is of the Bi-CMOS circuit. A third reference voltage level Vref" is supplied to the ECL logic circuit 42n, the first and second level shifters 42q and 42r and the current mirror circuit 42d, and an output signal OUT takes place at the output node of the second level shifter 42r.

The CMOS inverters of the first component circuit 42o are coupled between the first power voltage line Vcc and the step-down power voltage line Vcc', and the CMOS invertors of the second component circuit 42p are coupled between the step-down power voltage line Vcc' and the second power voltage line Vee. By virtue of this arrangement, even if the component field effect transistors are scaled down, the component field effect transistors are hardly damaged. Current is directly supplied from the first power voltage line Vcc to the first component circuit 42o, and is reused by the second component circuit 42p. This results in improvement of power consumption.

Although particular embodiments of the present invention have been shown and described, it will be obvious to those skilled in the art that various changes and modifications may be made without departing from the spirit and scope of the present invention. For example, various functions may be assigned to the component circuits.

What is claimed is:

1. A semiconductor integrated circuit device fabricated on a single semiconductor chip, comprising:
    a) a first power voltage line for carrying a first power voltage level;
    b) a step-down power voltage line for carrying a step-down power voltage level;
    c) a second power voltage line for carrying a second power voltage level different from said first power voltage level as well as from said step-down power voltage level;
    d) a step-down circuit which operates to produce said step-down voltage level from said first and second power voltage levels, and supplies said step-down power voltage level to said step-down power voltage line;

e) at least one first logic circuit, coupled between said first power voltage line and said step-down power voltage line, which performs a first logic function; and f) at least one second logic circuit, coupled between said step-down power voltage line and said second power voltage line, which performs a second logic function which is different and independent from said first logic function.

2. A semiconductor integrated circuit device as set forth in claim 1, in which said at least one first logic circuit and at least one second logic circuit include respective component transistors, said respective component transistors being of different type.

3. A semiconductor integrated circuit device as set forth in claim 1, wherein said at least one first logic circuit and at least one second logic circuit include respective component transistors, said respective component transistors being of identical type.

4. A semiconductor integrated circuit device fabricated on a single semiconductor chip, comprising:

a) a first power voltage line for carrying a first power voltage level;

b) a step-down power voltage line for carrying a step-down power voltage level;

c) a second power voltage line for carrying a second power voltage level different from said first power voltage level as well as from said step-down power voltage level;

d) a step-down circuit which operates to produce said step-down voltage level from said first and second power voltage levels, and supplies said step-down power voltage level to said step-down power voltage line;

e) at least one first logic circuit, coupled between said first power voltage line and said step-down power voltage line, which performs a first logic function; and f) at least one second logic circuit, coupled between said step-down power voltage line and said second power voltage line, which performs a second logic function which is different and independent from said first logic function;

wherein said first and second logic circuits form in combination a parallel data processing path provided in a serial data processing path, said serial data processing path being operative in synchronism with a high frequency clock signal twice as high in frequency as a low frequency clock signal for said parallel data processing path.

5. A semiconductor integrated circuit device as set forth in claim 1, in which said step-down circuit comprises:

d-1) a voltage divider coupled between said first and second power voltage lines, and producing a reference voltage level;

d-2) a first transistor of a first channel conductivity type and a second transistor of a second channel conductivity type opposite to said first channel conductivity type; said first and second transistors being arranged in a series combination and being coupled between said first and second power voltage lines responsive to a control signal for complementarily changing channel conductances thereof, thereby regulating said step-down power voltage level to said reference voltage level; and d-3) an operational amplifier circuit having a first input node supplied with said reference voltage level, a second input node supplied with said step-down power voltage level and an output node for supplying said control signal to said series combination of said first and second transistors.

6. A semiconductor integrated circuit device as set forth in claim 1, in which said step-down circuit comprises:

d-1) a voltage divider coupled between said first and second power voltage lines, and producing a reference voltage level;

d-2) a first transistor of a first channel conductivity type and a second transistor of a second channel conductivity type opposite to said first channel conductivity type; said first and second transistors being arranged in a series combination and being coupled between said first and second power voltage lines, responsive to a control signal for complementarily changing channel conductances thereof, thereby regulating said step-down power voltage level to said reference voltage level; and d-3) a current mirror circuit responsive to said reference voltage level and said step-down power voltage level for producing said control signal.

7. A semiconductor integrated circuit device fabricated on a single semiconductor chip, comprising:

a) a first power voltage line for carrying a first power voltage level;

b) a step-down power voltage line for carrying a step-down power voltage level;

c) a second power voltage line for carrying a second power voltage level different from said first power voltage level as well as from said step-down power voltage level;

d) a step-down circuit which operates to produce said step-down voltage level from said first and second power voltage levels, and supplies said step-down power voltage level to said step-down power voltage line;

e) at least one first logic circuit coupled between said first power voltage line and said step-down power voltage line;

f) at least one second logic circuit coupled between said step-down power voltage line and said second power voltage line; and g) a third logic circuit coupled between said first and second power voltage lines.

8. A semiconductor integrated circuit device fabricated on a single semiconductor chip, comprising:

a) a first power voltage line for carrying a first power voltage level;

b) a step-down power voltage line for carrying a step-down power voltage level;

c) a second power voltage line for carrying a second power voltage level different from said first power voltage level as well as from said step-down power voltage level;

d) a step-down circuit which operates to produce said step-down voltage level from said first and second power voltage levels, and supplies said step-down power voltage level to said step-down power voltage line, said step-down circuit comprising:

d-1) a voltage divider coupled between said first and second power voltage lines, and producing a reference voltage level;

d-2) a first transistor of a first channel conductivity type and a second transistor of a second channel conductivity type opposite to said first channel conductivity type; said first and second transistors being arranged in a series combination and being coupled between said first and second power voltage lines, responsive to a control signal for complementarily changing channel conductances thereof, thereby regulating said step-down power voltage level to said reference voltage level; and d-3) an operational amplifier circuit having a first input node supplied with said reference voltage level, a second input node supplied with said step-down power voltage level and an output node for supplying said control signal to said series combination of said first and second transistor;

e) at least one first logic circuit coupled between said first power voltage line and said step-down power voltage line, which performs a first logic function;

f) at least one second logic circuit, coupled between said step-down power voltage line and said second power voltage line, which performs a second logic function which is different and independent from said first logic function; and g) a plurality of third logic circuits, coupled between said first and second power voltage lines, and forming in combination a serial data processing path;

wherein a combination of said first and second logic circuits forms a parallel data processing path provided in said serial data processing path, said serial data processing path being operative in synchronism with a high frequency clock signal twice as high in frequency as a lower frequency clock signal for said parallel data processing path.

9. A Bi-CMOS integrated circuit device fabricated on a single semiconductor chip, comprising:

a) a first power voltage line for carrying a first power voltage level;

b) a step-down power voltage line for carrying a step-down power voltage level;

c) a second power voltage line for carrying a second power voltage level different from said first power voltage level as well as from said step-down power voltage level;

d) a step-down circuit which operates to produce said step-down voltage level from said first and second power voltage levels, and supplies said step-down power voltage level to said step-down power voltage line, said step-down circuit comprising:

d-1) a voltage divider coupled between said first and second power voltage lines, and producing a reference voltage level;

d-2) a first transistor of a first channel conductivity type and a second transistor of a second channel conductivity type opposite to said first channel conductivity type; said first and second transistors being arranged in a series combination and being coupled between said first and second power voltage lines, responsive to a control signal for complementarily changing channel conductances thereof, thereby regulating said step-down power voltage level to said reference voltage level; and d-3) a current mirror circuit responsive to said reference voltage level and said step-down power voltage level for producing said control signal;

e) at least one first logic circuit coupled between said first power voltage line and said step-down power voltage line, which performs a first logic function;

f) at least one second logic circuit, coupled between said step-down power voltage line and said second power voltage line, which performs a second logic function which is different and independent from said first logic function;

g) at least one third logic circuit coupled between said first and second power voltage lines;

h) a first level shifter, coupled between said at least one third logic circuit and said first and second logic circuits, which operates to supply an input data signal to said first and second logic circuits; and i) a second level shifter, coupled with said first and second logic circuits, which operates to relay an output signal of said firs and second logic circuits.

* * * * *